(12) United States Patent
Ostermeyer et al.

(10) Patent No.: US 8,175,863 B1
(45) Date of Patent: May 8, 2012

(54) SYSTEMS AND METHODS FOR ANALYZING PERFORMANCE OF VIRTUAL ENVIRONMENTS

(75) Inventors: John Andrew Ostermeyer, Manchester, MO (US); James Michael Hofer, O'Fallon, MO (US); Mark Steven Childers, Webster Groves, MO (US); Michael Hugh Condy, Dunoon (GB)

(73) Assignee: Quest Software, Inc., Aliso Viejo, CA (US)

( * ) Notice: Subject to any disclaimer, the term of this patent is extended or adjusted under 35 U.S.C. 154(b) by 522 days.

(21) Appl. No.: 12/370,399

(22) Filed: Feb. 12, 2009

Related U.S. Application Data

(60) Provisional application No. 61/028,312, filed on Feb. 13, 2008.

(51) Int. Cl.
*G06F 9/50* (2006.01)

(52) U.S. Cl. .......... 703/22; 703/6; 703/13; 715/734; 715/736; 715/763; 726/6; 718/1; 709/223

(58) Field of Classification Search .......... 703/6, 13, 703/22; 715/249, 734, 736, 763; 726/6; 718/1; 709/223
See application file for complete search history.

(56) References Cited

U.S. PATENT DOCUMENTS

| | | | |
|---|---|---|---|
| 3,701,971 A | 10/1972 | Sanner et al. | |
| 3,839,707 A | 10/1974 | Woodward et al. | |
| 4,468,728 A | 8/1984 | Wang | |
| 4,683,532 A | 7/1987 | Yount et al. | |
| 4,937,740 A | 6/1990 | Agarwal et al. | |
| 5,103,394 A | 4/1992 | Blasciak | |
| 5,321,838 A | 6/1994 | Hensley et al. | |
| 5,375,199 A | 12/1994 | Harrow et al. | |
| 5,432,932 A | 7/1995 | Chen et al. | |
| 5,450,586 A | 9/1995 | Kuzara et al. | |
| 5,493,658 A | 2/1996 | Chiang et al. | |
| 5,517,629 A | 5/1996 | Boland | |
| 5,528,753 A | 6/1996 | Fortin | |
| 5,539,907 A | 7/1996 | Srivastava et al. | |
| 5,572,640 A * | 11/1996 | Schettler ........................ 345/440 |
| 5,600,789 A | 2/1997 | Parker et al. | |
| 5,649,187 A | 7/1997 | Hornbuckle | |
| 5,671,351 A | 9/1997 | Wild et al. | |
| 5,673,386 A | 9/1997 | Batra | |

(Continued)

OTHER PUBLICATIONS

"Instance Monitor The Real-Time Database Monitoring and Diagnostic Solution for Oracle," Brochure, Quest Software, Inc. 1999, 2 pages.

(Continued)

*Primary Examiner* — Kamini S Shah
*Assistant Examiner* — Kibrom Gebresilassie
(74) *Attorney, Agent, or Firm* — Knobbe Martens Olson & Bear LLP

(57) ABSTRACT

Intelligent monitoring systems and methods for virtual environments are disclosed that understand various components of a virtual infrastructure and how the components interact to provide improved performance analysis to users. In certain examples, a monitoring system assesses the performance of virtual machine(s) in the context of the overall performance of the physical server(s) and the environment in which the virtual machine(s) are running. For instance, the monitoring system can track performance metrics over a determined period of time to view changes to the allocation of resources to virtual machines and their location(s) on physical platforms. Moreover, monitoring systems can utilize past performance information from separate virtual environments to project a performance impact resulting from the migration of a virtual machine from one physical platform to another.

18 Claims, 11 Drawing Sheets

U.S. PATENT DOCUMENTS

| | | | | |
|---|---|---|---|---|
| 5,684,945 | A | 11/1997 | Chen et al. | |
| 5,708,775 | A | 1/1998 | Nakamura | |
| 5,715,388 | A | 2/1998 | Tsuchihashi | |
| 5,715,415 | A | 2/1998 | Dazey et al. | |
| 5,720,018 | A | 2/1998 | Muller et al. | |
| 5,740,357 | A | 4/1998 | Gardiner et al. | |
| 5,748,881 | A | 5/1998 | Lewis et al. | |
| 5,752,062 | A | 5/1998 | Gover et al. | |
| 5,768,501 | A | 6/1998 | Lewis | |
| 5,872,909 | A | 2/1999 | Wilner et al. | |
| 5,881,306 | A | 3/1999 | Levine et al. | |
| 5,903,453 | A | 5/1999 | Stoddard, II | |
| 5,903,898 | A | 5/1999 | Cohen et al. | |
| 5,911,048 | A | 6/1999 | Graf | |
| 5,960,425 | A | 9/1999 | Buneman et al. | |
| 5,978,594 | A | 11/1999 | Bonnell et al. | |
| 5,983,366 | A | 11/1999 | King | |
| 6,018,567 | A * | 1/2000 | Dulman | 379/32.03 |
| 6,029,170 | A | 2/2000 | Garger et al. | |
| 6,035,412 | A | 3/2000 | Tamer et al. | |
| 6,128,016 | A * | 10/2000 | Coelho et al. | 715/808 |
| 6,148,335 | A * | 11/2000 | Haggard et al. | 709/224 |
| 6,199,199 | B1 | 3/2001 | Johnston et al. | |
| 6,330,008 | B1 | 12/2001 | Razdow et al. | |
| 6,351,754 | B1 | 2/2002 | Bridge et al. | |
| 6,473,791 | B1 * | 10/2002 | Al-Ghosein et al. | 709/217 |
| 6,594,655 | B2 | 7/2003 | Tal et al. | |
| RE38,270 | E | 10/2003 | Nakajima | |
| 6,771,646 | B1 | 8/2004 | Sarkissian et al. | |
| 6,901,582 | B1 | 5/2005 | Harrison | |
| 7,127,324 | B2 | 10/2006 | Batori et al. | |
| 7,363,211 | B1 | 4/2008 | Naganathan et al. | |
| 7,480,866 | B2 * | 1/2009 | Germain et al. | 715/736 |
| 7,512,888 | B2 * | 3/2009 | Sugino et al. | 715/734 |
| 7,587,492 | B2 * | 9/2009 | Dyck et al. | 709/226 |
| 7,620,984 | B2 * | 11/2009 | Kallahalla et al. | 726/22 |
| 7,685,251 | B2 * | 3/2010 | Houlihan et al. | 709/215 |
| 7,784,027 | B2 * | 8/2010 | Harrison | 717/113 |
| 7,792,941 | B2 * | 9/2010 | Fried et al. | 709/223 |
| 7,882,216 | B2 * | 2/2011 | Houlihan et al. | 709/224 |
| 7,917,617 | B1 * | 3/2011 | Ponnapur et al. | 709/224 |
| 7,979,245 | B1 | 7/2011 | Bourlatchkov et al. | |
| 8,051,162 | B2 * | 11/2011 | Arlitt et al. | 709/224 |
| 8,051,382 | B1 * | 11/2011 | Kingdom et al. | 715/769 |
| 8,103,638 | B2 * | 1/2012 | Voznika et al. | 707/687 |
| 8,112,366 | B2 * | 2/2012 | Hollingsworth et al. | 706/11 |
| 2003/0009551 | A1 | 1/2003 | Benfield et al. | |
| 2003/0028630 | A1 | 2/2003 | Bischof et al. | |
| 2004/0030592 | A1 * | 2/2004 | Buck et al. | 705/10 |
| 2004/0059812 | A1 | 3/2004 | Assa | |
| 2005/0021743 | A1 | 1/2005 | Fleig et al. | |
| 2007/0028239 | A1 * | 2/2007 | Dyck et al. | 718/1 |
| 2007/0043860 | A1 * | 2/2007 | Pabari | 709/224 |
| 2008/0077366 | A1 * | 3/2008 | Neuse et al. | 703/2 |
| 2008/0155537 | A1 * | 6/2008 | Dinda et al. | 718/1 |
| 2008/0222633 | A1 * | 9/2008 | Kami | 718/1 |
| 2008/0320269 | A1 * | 12/2008 | Houlihan et al. | 711/203 |
| 2009/0150538 | A1 * | 6/2009 | Tripathi et al. | 709/224 |
| 2009/0172666 | A1 * | 7/2009 | Yahalom et al. | 718/1 |
| 2009/0199177 | A1 * | 8/2009 | Edwards et al. | 718/1 |
| 2009/0222558 | A1 * | 9/2009 | Xu et al. | 709/224 |
| 2009/0241108 | A1 * | 9/2009 | Edwards et al. | 718/1 |
| 2009/0300605 | A1 * | 12/2009 | Edwards et al. | 718/1 |
| 2010/0114554 | A1 * | 5/2010 | Misra | 703/22 |
| 2010/0229096 | A1 * | 9/2010 | Maiocco et al. | 715/734 |
| 2011/0119748 | A1 * | 5/2011 | Edwards et al. | 726/12 |
| 2011/0161851 | A1 * | 6/2011 | Barber et al. | 715/769 |
| 2011/0302577 | A1 * | 12/2011 | Reuther et al. | 718/1 |
| 2012/0030346 | A1 * | 2/2012 | Fukuda et al. | 709/224 |

OTHER PUBLICATIONS

Boucher et al., Essential Guide to Object Monitors, Mar. 1999, whole book.

Dewan, et al. "A High-Level and Flexible Framework for Implementing Multiuser User Interfaces", 1992, ACM, p. 345-380.

Distributed Management Task Force, Inc., "Common Information Model (CIM) Infrastructure Specification"; Version 2.3 Final; Oct. 4, 2005; 102 pages.

Harrison, "Building a High-Performance Oracle Database Server," and "Tuning the Database Server," in: "Oracle SQL High-Performance Tuning," (New Jersey. Prentice-Hall, 1997), pp. 363-364, 399-400.

Hitachi TP Broker User's Guide, Release 3.1, 1998, entire manual.

Laessig; "Score Big with JSR 77, the J2EE Management Specification", Javaworld; Jun. 14, 2002; 8 pages.

Muller, Focus on HP OpenView: A Guide to Hewlett Packard's Network Management Platform, 1995, entire book.

Savant Corporation, "Products," http://www.savant-corp.com/prods.html, 1 page downloaded from the World Wide Web on Nov. 16, 1999.

Savant Corporation, "Products," http://www.savant-corp.com/prods.html, 1 page, downloaded and printed from the World Wide Web on Feb. 15, 2000.

Savant Corporation, "Q Application Diagnostics," http:///savant-corp.com/qappd.html, 1 page, downloaded and printed from the World Wide Web on Nov. 16, 1999.

Savant Corporation, "Q Hot SQL," http:///www.savant-corp.com/qhsql.html, 1 page, downloaded and printed from the World Wide Web on Nov. 16, 1999.

Savant Corporation, "Q Instance Overview," http:///www.savant-corp.com/qiov.html, 1 page, downloaded and printed from the World Wide Web on Nov. 16, 1999.

Savant Corporation, "Q Job Queue Manager," http:///www.savant-corp.com/qjobq.html, 1 page, downloaded and printed from the World Wide Web on Nov. 16, 1999.

Savant Corporation, "Q Lock Manager," http:///www.savant-corp.com/qlock.html, 1 page, downloaded and printed from the World Wide Web on Nov. 16, 1999.

Savant Corporation, "Q Replay Viewer," http:///www.savant-corp.com/qreplay.html, 1 page downloaded and printed from the World Wide Web on Nov. 16, 1999.

Singh et al; "Designing Web Services with the JDEE™ 1.4 Platform," Chapter 6 (pp. 247-289), May 2004; 46 total pages.

Tang, et al. "Blending Structured Graphics and Layout", 1994, ACM, p. 167-174.

\* cited by examiner

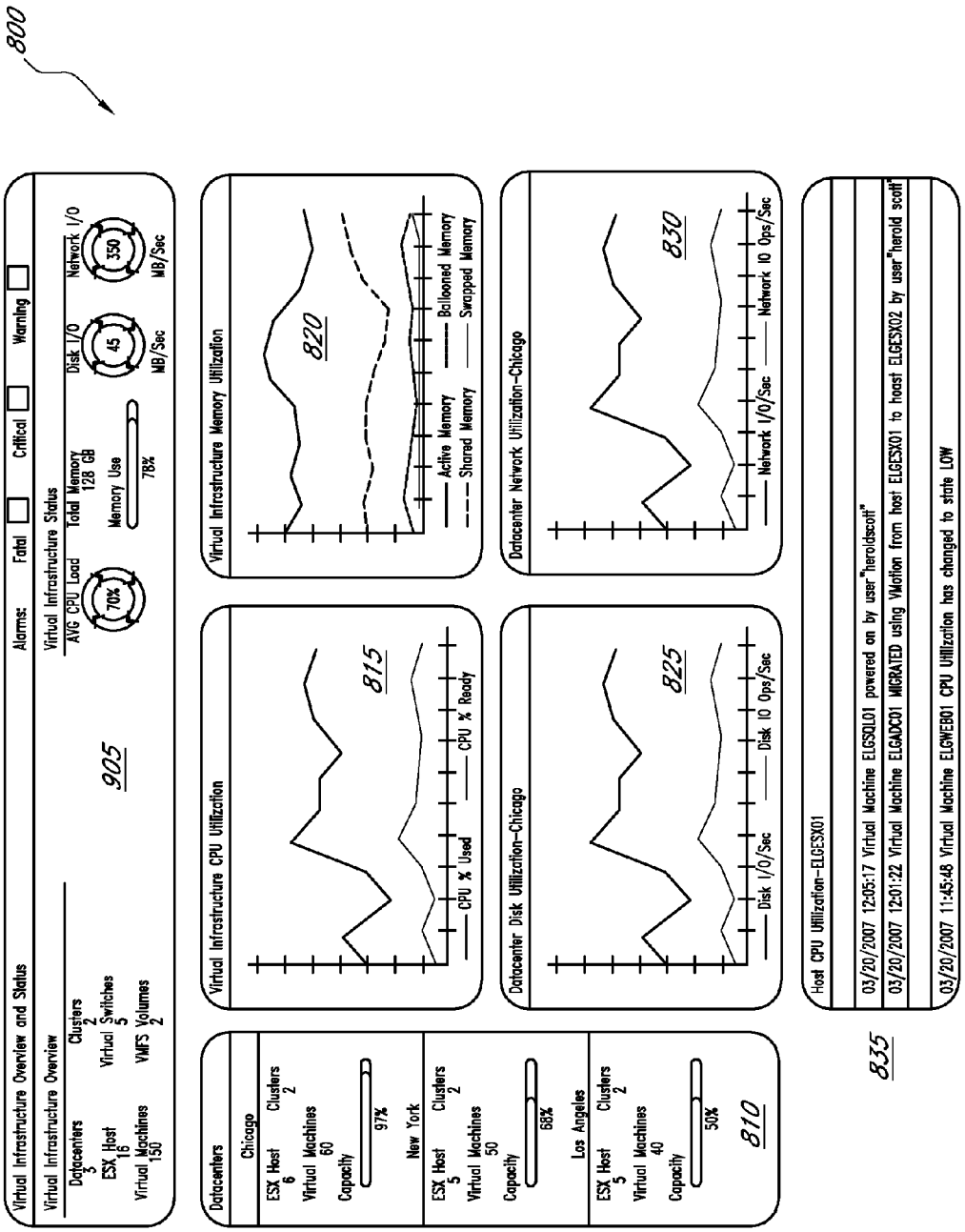

SYSTEMS AND METHODS FOR ANALYZING PERFORMANCE OF VIRTUAL ENVIRONMENTS

CROSS-REFERENCE TO RELATED APPLICATION

This application claims the benefit of priority under 35 U.S.C. §119(e) of U.S. Provisional Application No. 61/028,312, filed on Feb. 13, 2008, and entitled SYSTEMS AND METHODS FOR ANALYZING VIRTUAL ENVIRONMENTS, the entirety of which is hereby incorporated herein by reference to be considered part of this specification.

BACKGROUND

1. Field

Embodiments of the invention relate to monitoring virtual infrastructures and, in particular, to systems and methods for analyzing performance of interrelated objects in a virtual computing environment.

2. Description of the Related Art

Information technology specialists, or system administrators, are responsible for maintaining, managing, protecting and configuring computer systems and their resources. More and more, such maintenance includes ensuring multiple users local and remote access to vast resources of data over a great number of computer applications and systems, including the Internet. Moreover, system administrators are asked to provide access to these highly reliable systems at practically any time of day while ensuring the system's integrity is not threatened by dataflow bottlenecks or excessive overhead.

In addition, many companies now take advantage of virtualization solutions to consolidate several specialized physical servers and workstations into fewer servers running virtual machines. Understanding the performance of a virtual infrastructure, however, is a complex challenge. Performance issues with virtual machines can be based on a variety of factors, including what is occurring within the virtual machine itself, problems with the underlying platform, problems caused by consumption of resource(s) by other virtual servers running on the same underlying platform, and/or problems of priority and allocation of resource(s) to the virtual machine(s). When seeking to ensure performance and maximize uptime, administrators often struggle to understand and monitor the virtual infrastructure, and also to quickly diagnose and resolve problems. Additionally, being able to perform capacity planning and analysis, and in many cases, better understand utilization and costs associated with the virtual infrastructure compounds the challenge.

Moreover, performance statistics captured inside virtual machines for rates (e.g., bytes per second) and resource utilization (e.g., CPU utilization) can often be unreliable. For instance, problems with rate determinations can occur because a clock second inside a virtual image varies in duration and does not match a clock second in the physical or real world. In addition, many conventional monitoring systems are designed to operate strictly on a threshold approach, in which once a predetermined value is reached by a particular measurement, an alarm is triggered. Such monitoring systems oftentimes do not allow for flexibility in analyzing data in a virtual environment and/or do not provide the user with useful information to prevent, or correct, the underlying problem(s) prior to, or after, the alarm is triggered.

SUMMARY

In view of the foregoing, a need exists for more intelligent monitoring systems and methods for virtual environments. For instance, a need exists for monitoring systems and methods that utilize an understanding of the various components of a virtual infrastructure and how the components interact to provide improved performance analysis to users.

Certain systems and methods disclosed herein are directed to linking business services, performance and availability of applications to that which is occurring in one or more virtual environments to aid effective and efficient problem diagnosis. In certain embodiments, inventive systems and methods are disclosed for assessing the performance of a virtual machine in the context of the overall performance of the physical server and the environment in which the virtual machine is running. In certain circumstances, monitoring systems are able to determine if a performance issue detected in the virtual machine is actually the result of a bottleneck on the underlying physical platform (e.g., the host server). Certain embodiments of the invention can further determine the performance of, and/or priority assigned to, other related objects in the virtual environment, such as other virtual machines running on the same host server, to identify potential causes of problems.

In addition, in certain embodiments, disclosed monitoring systems and methods track performance metrics over a determined period of time to view changes to the allocation of resources to virtual machines and their location(s) in the physical world. By viewing the metrics over a particular time period, rather than applying a simple true-false threshold rule, monitoring systems and methods can better determine and predict when changes in metrics may signal a material effect upon performance.

Furthermore, certain embodiments of the invention are capable of assessing the impact of moving or migrating virtual machines between physical servers. For instance, a monitoring system can analyze the inter-relationships forced on different, independent virtual environments and how the operation of each virtual environment impacts the other(s). Moreover, certain embodiments of the invention can utilize past performance information from separate virtual environments to project a performance impact resulting from the migration of the virtual machine from one physical platform to another. For example, in certain embodiments, systems and methods disclosed herein can monitor migration of any number of virtual machines from disparate source systems to a particular target system taking into account any pre-existing load.

Yet other embodiments of the invention can leverage intelligent state propagation rules within an alarm mechanism that suppress broadcast storms of low-level alerts, as well as ensure specific alarms are not raised too high within the organization of the virtual infrastructure. As an example, if a host server of a virtual computing environment fails, a single alert can be escalated to the parent cluster stating that a host failure has occurred. Additionally, the individual virtual machines that are impacted by the host failure can contain their alarms at the virtual machine level so as to not alert an administrator multiple times of the same failure.

In other embodiments, if a particular virtual machine or group of virtual machines begins to consume more CPU or memory resources based on a particular operation that changes the state of the system, an alarm can be contained at the host object level and would not signify major problems at a higher-level object (e.g., a cluster or datacenter object).

In certain embodiments, a system is disclosed for monitoring data in a virtual computing environment. The system comprises a topology module, a correlation module, a migration modeler module and a user interface module. The topology module receives object data indicative of a plurality of objects in a virtual computing environment. For example, the topology module can be further being configured to: (i) transform the object data into a topology model comprising a plurality of interconnected topology objects, the topology model being representative of existing relationships between the plurality of objects in the virtual computing environment, wherein the plurality of objects comprises at least a source physical platform, a virtual machine that operates on the source physical platform, and a target physical platform, (ii) receive metric data indicative of measured performance values associated with the plurality of objects, and (3) associate the metric data with the plurality of interconnected topology objects of the topology model. The correlation module correlates the associated metric data received or accumulated over a period of time. The migration modeler module receives input regarding an anticipated migration of the virtual machine from the source physical platform to the target physical platform, and is further configured to generate impact data indicative of a projected impact on resources of at least the target physical platform based on the anticipated migration of the virtual machine to the target physical platform and the correlated metric data. The user interface module receives the impact data and causes a graphical display on at least one interface of the projected impact on the resources of at least the target physical platform.

In certain embodiments, a method is disclosed for modeling performance of a virtual computing environment. The method comprises receiving metric data indicative of performance values associated with a plurality of objects in a virtual infrastructure, the plurality of objects comprising at least a first host server and a second host server, and associating the metric data with a topology model comprising a plurality of interconnected topology objects, the topology model being representative of relationships between the plurality of objects in the virtual infrastructure. The method further includes receiving input indicative of a migration of a virtual machine from the first host server to the second host server and generating, based at least on the associated metric data and the topology model, impact data indicative of an impact on resources of at least the second host server in response to the migration of the virtual machine to the second host server. The method also includes displaying, based on said impact data, on-screen graphics indicative of the projected impact on the resources of at least the second host server.

In certain embodiments, a system is disclosed for monitoring performance of a virtual computing environment. The system includes means for receiving metric data indicative of performance values associated with a plurality of objects in a virtual infrastructure, the plurality of objects comprising at least a first host server and a second host server. The system also includes means for associating the metric data with a topology model comprising a plurality of interconnected topology objects, the topology model being representative of relationships between the plurality of objects in the virtual infrastructure; means for receiving input indicative of a migration of a virtual machine from the first host server to the second host server; and means for generating, based at least on the associated metric data and the topology model, impact data indicative of an impact on resources of at least the second host server in response to the migration of the virtual machine to the second host server. In addition, the system comprises means for displaying, based on said impact data, on-screen graphics indicative of the projected impact on the resources of at least the second host server.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 8 illustrates an exemplary screen display of a user interface for monitoring the performance of a virtual infrastructure, according to certain embodiments of the invention.

DETAILED DESCRIPTION OF THE PREFERRED EMBODIMENTS

Certain embodiments of the disclosed systems and methods provide a virtualization monitoring solution that understands the relationships and interactions between components in a virtual infrastructure, helps administrators detect, diagnose and resolve incidents and problems, ensures performance, and/or performs capacity planning and chargeback. For example, certain embodiments of the invention allow an administrator or other user to visualize an entire virtual infrastructure through detailed architectural representations and to use alerts and expert advice to diagnose the cause(s) of problems affecting performance. Embodiments of the invention can also provide reports for capacity, performance, asset tracking, provisioning trends and/or infrastructure events to communicate current and available capacity to appropriate personnel and to identify growth due to provisioning.

In certain embodiments, disclosed systems and methods introduce a new level of intelligence in virtual infrastructure monitoring. For instance, rather than simply reporting statistics, embodiments of the invention can understand each object's role in the virtual environment and analyze performance data according to advanced rules and logic specific to that role. Moreover, rather than rely on rigid threshold alerting, embodiments of the invention provide a variety of alarms that identify problem trends and/or predict potential bottlenecks. Such a level of predictive analysis advantageously allows administrators to take preventative action and resolve performance and configuration issues before the workload of the virtual environment is significantly affected.

For instance, certain embodiments of the invention are capable of relating virtual images on one physical platform to one another so as to determine the effect that changes in utilization by one virtual image have on the performance of another virtual image. Moreover, such information can be used in load balancing the resources of physical machines in a virtual infrastructure.

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the invention and not to limit the scope of the disclosure.

In addition, methods and functions described herein are not limited to any particular sequence, and the blocks or states relating thereto can be performed in other sequences that are appropriate. For example, described blocks or states may be performed in an order other than that specifically disclosed, or multiple blocks or states may be combined in a single block or state.

Figure 1:
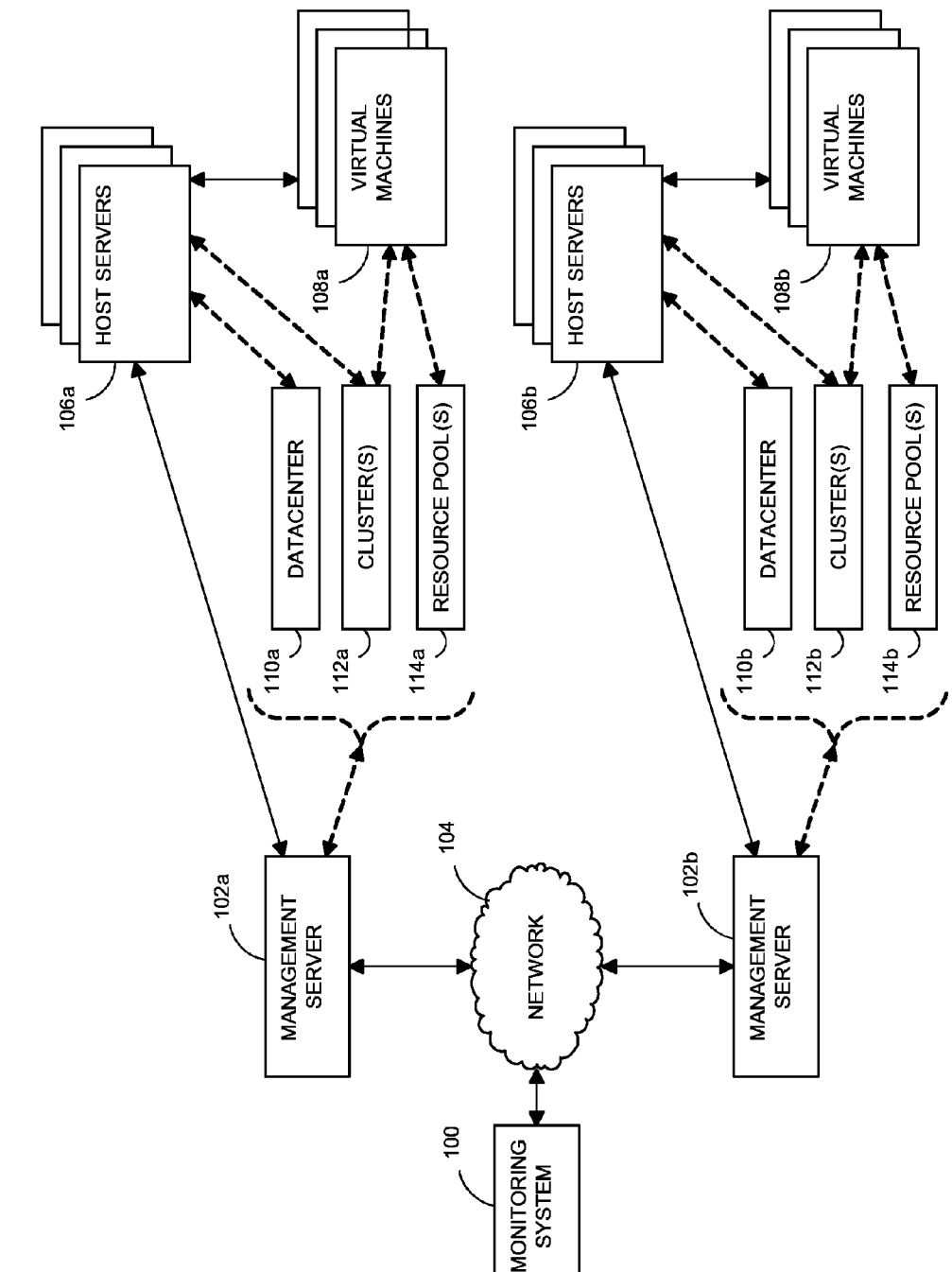
FIG. 1 illustrates an exemplary block diagram of a system for monitoring multiple virtual environments, according to certain embodiments of the invention.

FIG. 1 illustrates an exemplary block diagram of multiple virtual environments being monitored by a system 100, according to certain embodiments of the invention. In certain embodiments, the monitoring system 100 is configured to understand the relationships and interactions between components in the virtual infrastructure and to help administrators detect, diagnose and/or resolve incidents and problems relating to the performance of one or more components in the context of the entire virtual system.

For instance, as discussed in more detail herein, the monitoring system 100 can visualize the entire infrastructure through detailed architectural representations of the infrastructure. The monitoring system 100 can further use alerts and/or expert advice to diagnose problems affecting performance of components in the virtual environments. In certain embodiments of the invention, the monitoring system 100 can also provide reports for capacity, performance, asset tracking, provisioning trends, infrastructure events, combinations of the same and the like.

For exemplary purposes, certain embodiments of the inventive systems and methods will be described with reference to VMWARE (Palo Alto, Calif.) virtual infrastructures. However, it will be understood from the disclosure herein that the disclosed systems and methods can be utilized with other virtualization technologies, including, but not limited to, virtual environments using XEN and XENSERVER by Citrix Systems, Inc. (Fort Lauderdale, Fla.), ORACLE VM by Oracle Corporation (Redwood City, Calif.), HYPER-V by Microsoft Corporation (Redmond, Wash.), VIRTUOZZO by Parallels, Inc. (Switzerland), or the like As shown, the monitoring system 100 communicates with management servers 102a, 102b through a network 104. In certain embodiments, the management servers 102a, 102b comprise VMWARE VirtualCenter management servers that provide a centralized management module for a virtual environment. For instance, each of the virtual environments can comprise a VMWARE Infrastructure 3 (VI3) environment or the like.

In certain embodiments, the monitoring system 100 interfaces with one or more of the management servers 102a, 102b through a collector that communicates with a web service description language (WSDL) software development kit (SDK) to capture and/or manipulate characteristics of the virtual infrastructure configuration and performance metrics of the various object levels found in the environment. For instance, the monitoring system 100 can query the management server 102a, 102b periodically (e.g., every two minutes) to receive new information, such as performance data and/or object properties, relating to the virtual environment. In certain embodiments, each management server 102a, 102b that is to be monitored can advantageously have an agent configured to point to the particular SDK interface. Moreover, in certain embodiments, particular metrics regarding the consumption of physical resources can be acquired through VMWARE's SOAP SDK.

The network 104 provides a wired and/or wireless communication medium between the monitoring system 100 and the management servers 102a, 102b. In certain embodiments, the network 104 can comprise a local area network (LAN). In yet other embodiments, the network can comprise one or more of the following: internet, intranet, wide area network (WAN), public network, combinations of the same or the like. In addition, connectivity to the network 104 may be through, for example, remote modem, Ethernet, token ring, fiber distributed datalink interface (FDDI), asynchronous transfer mode (ATM), combinations of the same or the like.

The illustrated management server 102a communicates with one or more physical platforms or host servers 106a, such as a VMWARE ESX server. In certain embodiments, the management server 102a can manage the operation of the host servers 106a and/or any virtual machine operating thereon.

Operating on the host servers 106a is a plurality of virtual machines 108a. In certain embodiments, hypervisors installed on the host server 106a are configured to decouple the physical hardware of the host servers 106a from the operating system(s) of the virtual machine(s) 108a. Such abstraction allows, for example, for multiple virtual machines 108a with heterogeneous operating systems and applications to run in isolation on the same physical platforms.

In certain embodiments, each of the virtual machines 108a shares resources of the host servers 106a, and in the event of an over-commitment of resources, the hypervisor determines which instances have priority to the underlying resources based on virtual machine 108a configurations. In certain further embodiments, each virtual machine 108a is contained within a single host server 106a at any particular time, although the virtual machine 108a can migrate between different host servers 106a or physical platforms.

As further illustrated by dashed lines, the management server 102a can be virtually associated with one or more virtual objects, including a datacenter 110a, cluster(s) 112a, one or more resource pools 114a, combinations of the same or the like. Moreover, virtual associations can exist between the host servers 106a and the datacenter 110a and/or cluster 112a and/or between the virtual machines 108a and the cluster 112a and/or the resource pool(s) 114a.

In certain embodiments, the datacenter 110a comprises the topmost object under a management server 102a and can generally be required before any host servers 106a are added to the management server 102a. In certain embodiments, the datacenter 110a object identifies the physical boundaries (e.g., a single physical location) in which the host servers 106a exist.

The cluster(s) 112a can comprise a group of host servers 106a that share a common configuration with respect to storage resources and network configurations. In certain embodiments, the cluster 112a presents a combined pool of all the collective resources of each host server 106a assigned to the cluster 112a. As an example, if four host servers 106a are added to the cluster 112a, and each host server 106a has 2×2 gigahertz (GHz) processors with four gigabytes (GB) of memory, the cluster 112a would represent an available pool of sixteen GHz and sixteen GB of memory available for virtual machine use.

In certain embodiments, the cluster(s) 112a can also serve as the boundary for virtual migration activity through, for example, VMOTION (by VMWARE), distributed resource scheduling (DRS) and/or high availability (HA) activity.

In certain embodiments, the resource pool(s) 114a allow for fine tuning configuration of resource allocations within the cluster(s) 112a. For instance, resource pool(s) 114a can be configured to leverage a portion of the overall available resources, and then virtual machines 108a can be assigned to a resource pool 114a. This, in certain embodiments, allows an administrator to assign priority and either limit or guarantee the necessary resources to groups of virtual machines 108a.

In certain embodiments, resource pools 114a can be configured in multiple arrangements. As an example, two resource pools 114a can be configured within a cluster 112a: one for production virtual machines and one for development virtual machines. The production resource pool can be configured with a "high" share priority, and the development resource pool can be configured with the default value of "normal" share priority. These configurations can dictate that a virtual machine placed into the production resource pool would automatically be given twice the priority to system resources during periods of contention than a virtual machine that resides in the development resource pool.

Although the monitoring system 100 has been described as communicating directly with the management servers 102a, 102b, in other embodiments of the invention, the monitoring system 100 can communicate directly with one or more other components or objects of the virtual infrastructures. For instance, one or more agents or collectors can be installed on the host servers 106a, 106b and/or the virtual machines 108a, 108b to provide the monitoring system 100 with performance data and/or object properties of components in the virtual environment. In certain embodiments, the agents can comprise touchless agents that utilize light-weight scripts that rely on native agents and/or commands to provide availability and/or utilization metrics.

Figure 2:
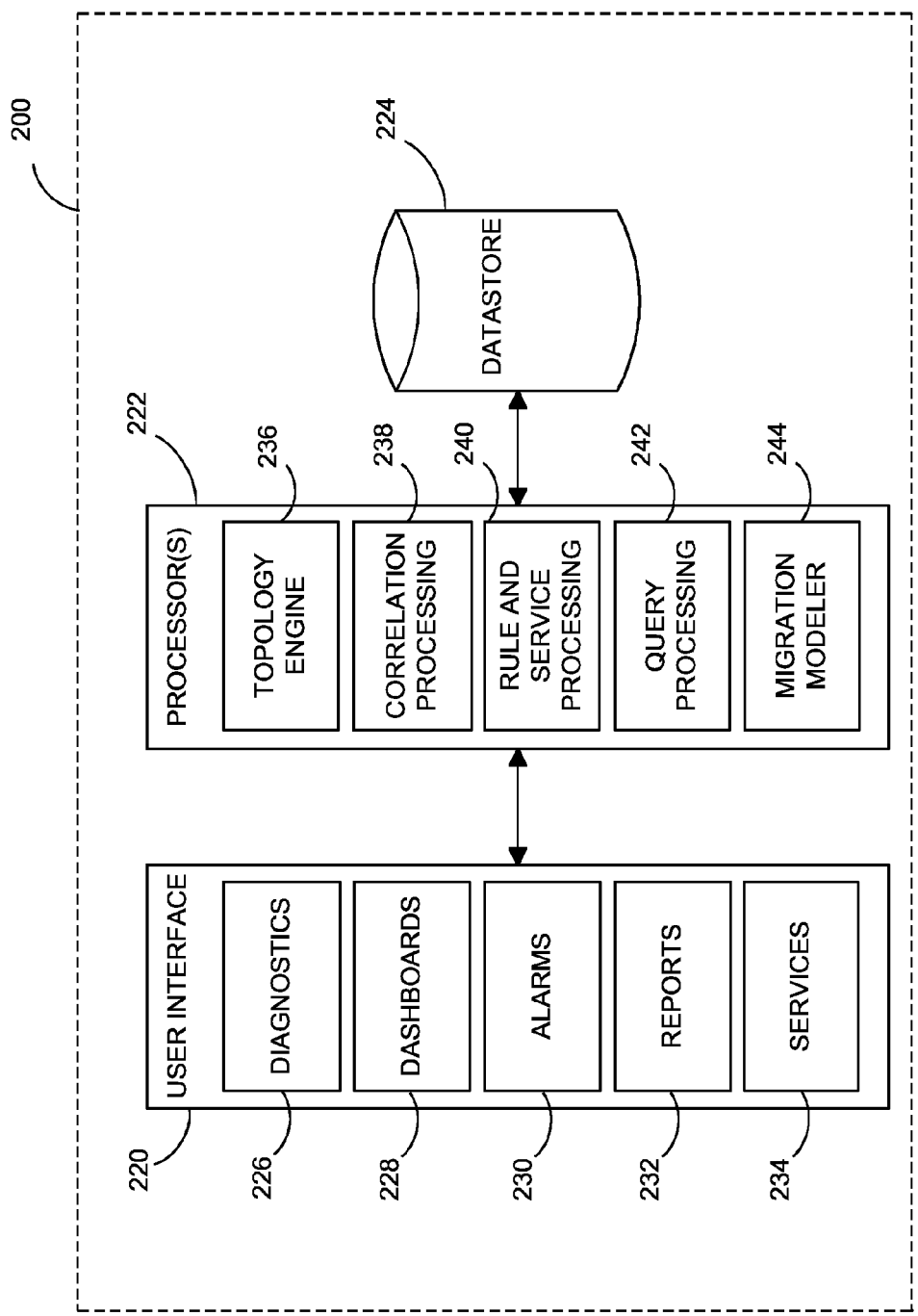
FIG. 2 illustrates a block diagram of an exemplary embodiment of the monitoring system of FIG. 1.

FIG. 2 illustrates a block diagram of a monitoring system 200, according to certain embodiments of the invention. In certain embodiments, the monitoring system 200 is capable of understanding the topology of a virtual environment, understanding the roles of objects therein and analyzing performance data according to advanced rules and logic specific to those roles. For instance, in certain embodiments, the monitoring system 200 can perform one or more functions of the monitoring system 100 of FIG. 1.

As shown, the monitoring system 200 includes a user interface 220, one or more processors 222 and a datastore 224. In general, the user interface 220 provides a comprehensive view of performance for one or more virtual environments being monitored, with specialized views for each level of virtual infrastructure. The user interface 220 can further provide a graphical representation of the topology of monitored virtual environment(s) and/or on-screen graphics that represent performance data of one or more objects in the monitored virtual environment(s).

For instance, the on-screen graphics can comprise text and/or graphical depictions having attributes that convey information to the user and may include, but are not limited to: graphs, messages, maps, icons, shapes, colors, labels, values, tables, meters, charts, alarms, audible alerts, timers, rotating icons, panels, combinations of the same or the like. Additional details of user interfaces usable with embodiment of the invention are disclosed in U.S. Pat. No. 6,901,582, issued May 31, 2005, which is hereby incorporated herein by reference in its entirety.

The processor(s) 222 comprise or execute multiple modules that analyze data collected about the virtual environments, such as received from management servers, host servers and/or virtual machines. Other data used by the processors 222 can be derived from existing data and/or rules. For instance, the data can include metrics (values measured over time) that are scoped to one or more topology types, raw metrics that are collected from the monitored virtual environment, derived metrics that are calculated from one or more raw or derived metrics, topology object properties (data collected from the monitored environment that describes a topology object), combinations of the same or the like.

The data used by the processors 222 can be stored in the datastore 224 and/or displayed through the tools of the user interface 220. The datastore 224 can comprise any one or group of storage media that is configured to record data.

As shown in FIG. 2, the user interface 220 comprises several tools in presenting performance data or alerts to a user in a straightforward format. Each of these tools will be described in more detail below. It will also be understood from the disclosure herein that the separation of functions and/or displays with respect to the below-described tools is merely exemplary and that any combination of tools can be used to produce an interface that is helpful to the user.

A diagnostics tool 226 provides an architectural representation of the monitored virtual environments. In certain embodiments, this representation advantageously allows a user to view how components of the monitored virtual environments interrelate and how the performance of one component impacts the performance of another.

Dashboards 228, in certain embodiments, comprise single-purpose screens that provide a user with a quick summary of a select component or group of components. For instance, certain dashboards 228 can provide numerical and/or graphical representations of utilization metrics associated with the single object (e.g., datacenter, cluster, host server, resource pool, virtual machine, datastore or the like) or collection of objects. The dashboards 228 can be further associated with additional views that provide statistical information for one or more objects being viewed in the dashboard.

For example, in certain embodiments, embedded views can comprise one or more of the following:

Top 5 CPU View: shows the top five CPU-consuming virtual machines for the selected object Top 5 Memory View: shows the top five memory-consuming virtual machines for the selected object Top 5 Disks View: shows the top five virtual machines in terms of disk activity for the selected object Top 5 NIC View: shows the top five virtual machines in terms of NIC activity for the selected object Top 5 Ready View: shows the top five virtual machines in terms of percent readiness for CPU cycles for the selected object Status View: provides a summary of the present status of the parent object for a selected virtual machine Additional views can further comprise information about descendent or child objects of the object being viewed in a dashboard 228. For instance, the dashboard 228 can display the total number of various types of child objects within the selected object and the outstanding alarm with the highest severity that exists for an object of each type.

If certain embodiments, particular on-screen graphics of the dashboard 228 allow a user to drill down to identify additional information with respect to a particular component, performance data or alarm. For instance, if the user selects (e.g., clicks) a graphical representation (e.g., an icon) of one of the monitored objects, a popup window can appear that displays a current alarm list for the corresponding object type. If the user then selects a particular alarm message, he/she is taken to the dashboard 228 for the object to which the message corresponds.

The user interface 220 further includes an alarms tool 230 that provides a display for viewing alarms associated with the virtual infrastructure. In certain embodiments, the alarms are grouped by object and severity level. The alarms tool 230 can, in certain embodiments, be used to monitor alarms and to identify the sources of problems within the monitored virtual infrastructures.

In certain embodiments, the alarms tool 230 includes a table with multiple rows that each contain an object icon that identifies the source of the alarm, an alarm icon that indicates the severity of the alarm, the time that the alarm occurred, and/or the text of the alarm. Columns associated with the rows can be sortable so that alarms can be listed in order by source, severity, time or message. In certain embodiments, if the user selects an alarm's severity icon, a popup window can be displayed that acknowledges or clears the particular alarm. Moreover, if the user selects the message or any other column in the row, the corresponding dashboard 228 displaying information pertaining to the corresponding object appears.

A reports tool 232, in certain embodiments, provides a list of templates that can be used to create reports that are scheduled to run against a particular object or to view reports that have already been completed.

The services tool 234 allows a user to construct groups of virtual machines for viewing on the user interface 220. In certain embodiments, the services tool 234 provides a mechanism for relating the virtual infrastructure back to the applications and business services that it supports. For example, the service tool 234 can enable service and application owners to investigate service availability and performance problems more directly by providing a straightforward root-cause analysis. In other embodiments, the services tool 234 can be used to logically group information for chargeback and/or capacity planning.

As illustrated, the processors 222 comprise or execute one or more components for analyzing data with respect to monitored virtual environments. A topology module or engine 236 receives data from a virtual environment and determines associations between components of the environment. For instance, the topology engine 236 can build topology models or graphs of dependencies between components and datastores so that the user display can show potential impacts between components (e.g., through the diagnostics 226).

The topology engine 236 can be further capable of receiving monitored data (e.g., metrics and/or topology object properties) and associating the monitored data with the objects of the topology model. Moreover, the topology engine 236 can associate existing topology objects with new topology objects representing components added to the virtual infrastructure over time. In certain embodiments, the topology engine 236 utilizes model-generation methods similar to those described in U.S. patent application Ser. No. 11/749,559, now U.S. Pat. No. 7,979,245, filed May 16, 2007, entitled "Model-Based Systems and Methods for Monitoring Resources," which is hereby incorporated herein by reference in its entirety.

Figure 3:
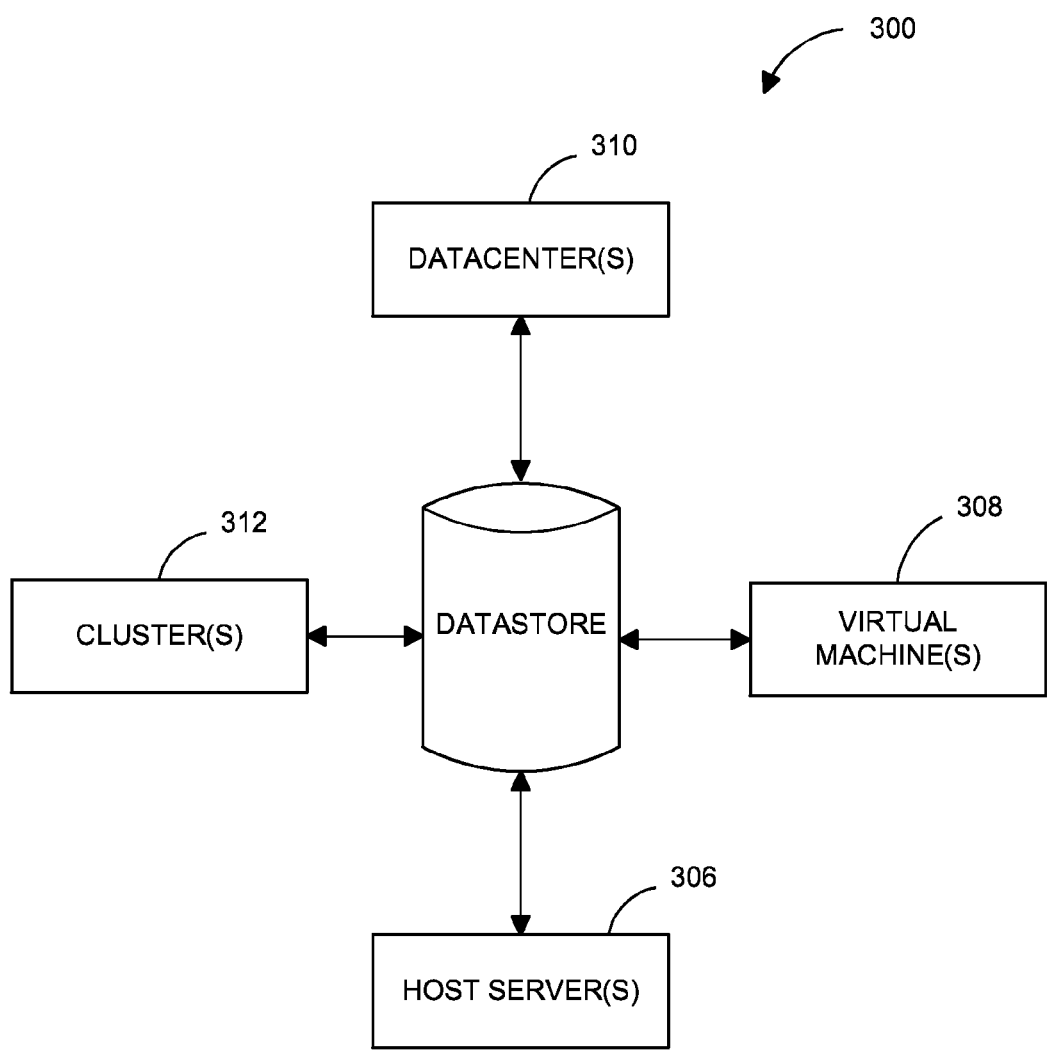
FIG. 3 illustrates a simplified diagram of an exemplary topology graph generated by a topology engine of the monitoring system of FIG. 1.

FIG. 3 illustrates a simplified diagram of a topology model or graph 300 that associates host servers 306, virtual machines 308, datacenters 310 and clusters 312 with a particular datastore 314. In certain embodiments, the topology engine 236 constructs this graph based on information received from a remote agent (e.g., a connector or collector). For instance, in a VMWARE virtual infrastructure, the topology engine 236 can collect data from the VirtualCenter server web service API and process the data to produce summary data for higher-level components of the virtual infrastructure (e.g., total CPU available in a datacenter). In certain further embodiments, the remote agent formats the received data into one or more XML files, which the remote agent passes back over HTTP(S) to the management server 102a, 102b for consumption by the monitoring system 100.

With continued reference to FIG. 2, a correlation processing module or engine 238 further compiles and/or analyzes data associated with the topology graph and/or stored in the datastore 224. For instance, the correlation processing module 238 can analyze performance data received over a particular period of time. Such data can be particularly useful, for instance, when projecting a resource impact on one or more objects in response to a change in the virtual environment.

A rule and service processing module or engine 240 is configured to apply one or more rules to data obtained about the monitored virtual system. In certain embodiments, the user is allowed to create flexible rules, such as through a groovy script, or the like, that can be applied to interrelated data from multiple sources within the monitored environment. For instance, the user may be able to associate several actions with a particular rule, configure a rule so that it does not fire repeatedly, associate a rule with schedules to define when the rule should be evaluated, combinations of the same or the like.

Different types of data can be used in connection with the rules, including, but not limited to, registry variables, raw metrics, derived metrics, topology object properties, combinations of the same or the like. Moreover, rules can take on straightforward threshold determinations, such as a rule with a single condition with one of three states (e.g., fire, undefined or normal). Other more complex rules can take on additional severity levels (e.g., undefined, fatal, critical, warning or normal).

In certain embodiments, the rule and service processing engine 240 regularly evaluates rules against monitored data (e.g., metrics and topology object properties). Thus, the state of a rule can change as the data changes. For example, if a set of monitoring data matches a rule's condition, the rule can enter the "fire" state. If the next set of monitored data does not match the condition, the rule exits the "fire" state and enters the "normal" state.

In certain embodiments, the rule and service processing engine 240 dictates when one or more alarms 230 is issued to a user, such as through the user interface 220. The rule and service processing engine 240 can advantageously communicate with the topology engine 236 and the correlation processing engine 238 to associate the alarms and/or received metrics with particular objects within the virtual environment and present such alarms or information to the user in the context of the monitored virtual environment. This advantageously allows the user to understand the context of the alarm, quickly identify the cause of the problem and take appropriate corrective action.

In certain embodiments, the rule and service processing engine 240 can suppress alarm storms in which an alarm with respect to one component of a virtual infrastructure can trigger other alarms with respect to other components of the same virtual infrastructure. For instance, based on predefined rules, the rule and service processing engine 240 may identify that a virtual machine is consuming too much memory. Because the virtual machine executes on a particular host server, an alarm raised on the virtual machine can further prompt an alarm with respect to the host server. Moreover, if the host server is part of a cluster and/or datacenter, additional alarms may be raised with respect to these virtual components.

To prevent the user from being inundated with the plurality of alarms, the rule and service processing engine 240 communicates with the topology engine 236 and/or correlation processing engine 238 to analyze the alarm in the context of the entire monitored virtual infrastructure. That is, knowing the structure and interconnections of components of the virtual infrastructure, the monitoring system 200 is suited to identify and disregard duplicative alarms. The correlation processing engine 238 then correlates the plurality of alarms so that a single alarm can be provided to the user through the user interface 220.

A wide variety of system-defined and/or user-defined rules can be used with embodiments of the invention. Examples of such rules include, but are not limited to rules that: monitor for spikes, dramatic drops and/or sustained high levels in CPU utilization for a cluster; issue an alarm to report that a virtual machine requesting CPU cycles from the host server is not receiving the CPU cycles for some percentage of the time; issue an alarm to report that if a host server within the cluster fails, the remaining servers in the cluster may not or do not have enough available CPU and/or memory to handle the increased workload from the associated virtual machines; monitor for upward trends in memory utilization for a host server; and compare the amount of memory that is being requested by virtual machines on a host server to the amount of memory available on the host server (e.g., if the application workload of the host server is requesting an excessive amount of the available memory resources, the user can be prompted to add memory to the host server and/or move the virtual machines across the servers within the cluster).

The processors 222 further comprise a query processing module 242 that satisfies particular system- or user-generated queries. For instance, in certain embodiments, the query processing module 242 obtains data from the datastore 224 for populating the on-screen graphics of the user interface 220.

A migration modeler or coordinator 244 of the processors 222 monitors the migration of a virtual machine between two physical platforms. In certain embodiments, the migration modeler 244 determines the impact such a migration has on the resources of the virtual infrastructure, such as the resources of the host servers directly involved with the migration. In other embodiments, the migration modeler 244 can project an impact of an anticipated migration of a virtual machine.

In certain embodiments, the migration modeler 244 communicates with the topology engine 236 and/or the correlation processing engine 238 to obtain data (e.g., from the datastore 224) that reflects the state of the virtual environment prior to the migration. The migration modeler 244 can then overlay the performance information related to the virtual machine over the performance information of the target host server to determine the impact of the migration. In certain embodiments, this impact can reflect the projected performance of the migrated virtual machine, the target host server and/or other virtual machines running on the target host server. The migration modeler 244 can further communicate with the user interface 220 to graphically display to the user the determined or projected impact on system resources that results from migrating a virtual machine.

Although the processor(s) 222 are described with reference to various modules and functions, it will be understood that one or more of the above-described modules can be combined into fewer modules and/or divided into additional modules that provide similar functionality.

Figure 4:
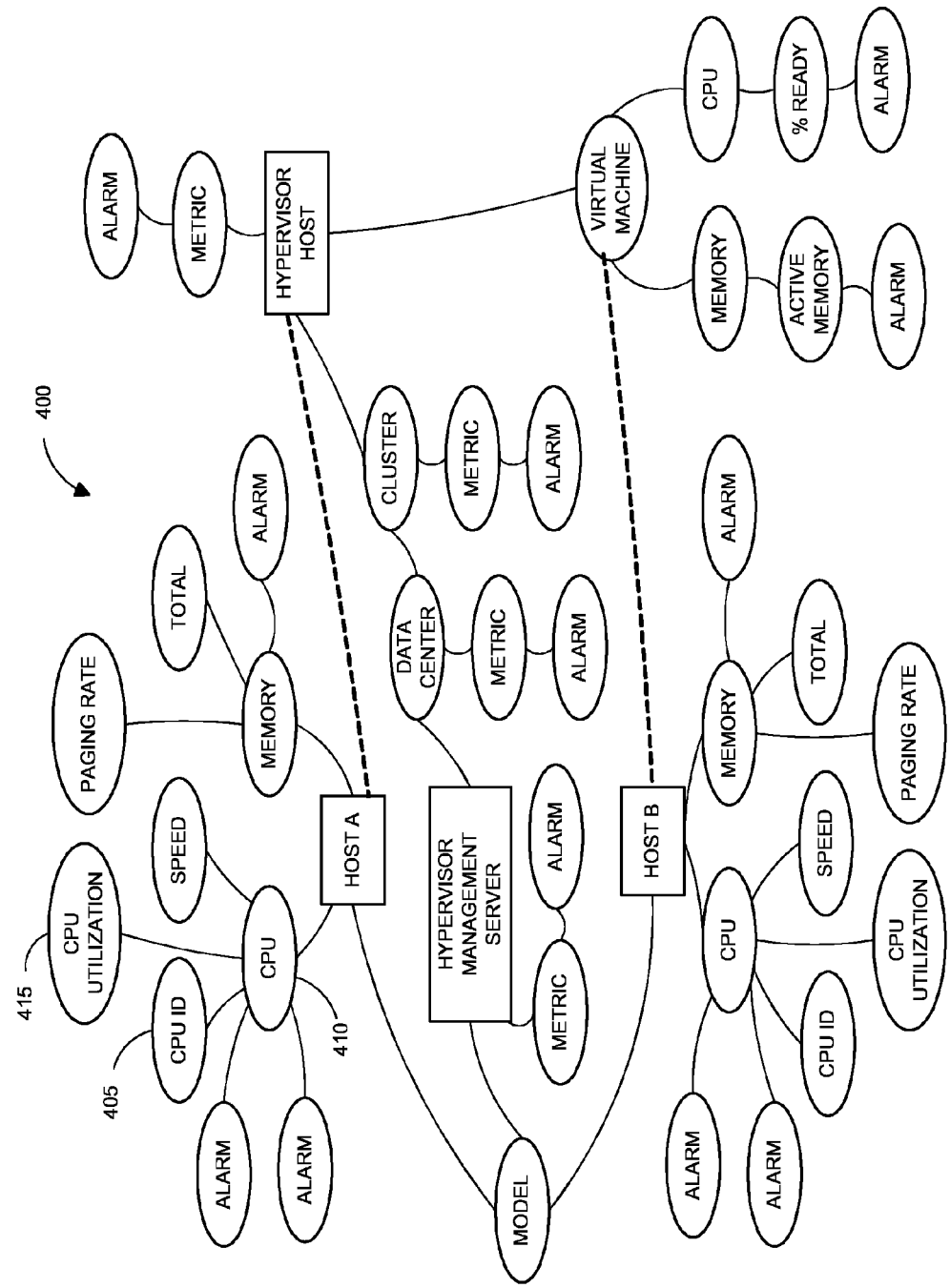
FIG. 4 illustrates a simplified diagram of an exemplary collection model of a virtual environment, according to certain embodiments of the invention.

FIG. 4 illustrates an exemplary embodiment of a simplified collection model 400 representing a virtual environment having two host servers, in which metric data and alarms are associated with the monitored components. In certain embodiments, the collection model 400 is created and used by the disclosed monitoring systems, such as monitoring system 200, to serve as a principle for organizing monitored data that the monitoring system 200 gathers from the virtual infrastructure. As shown, the model 400 can have a tree-like structure that contains hierarchically-arranged nodes that include associated properties, metrics, alarms and/or other nodes. The monitoring system 200 then adds these entities to the nodes in the model 400 as they are collected.

In certain embodiments, the monitoring system 200 makes use of a topology model to describe the logical and/or physical relationships between data nodes. For instance, the hierarchy in topology models provides the context for metrics and properties. While the monitoring system 200 may store context information only once, the relationship between nodes, metrics, properties, and other nodes can propagate the context across multiple data elements.

In certain embodiments, the monitoring system 200 stores metrics and properties together. Unlike properties, which describe nodes and are typically static in nature, metrics can change over time as data is collected. For example, in the illustrated host collection model 400, CPU ID 405 is a property that describes a CPU node 410, while CPU utilization 415 is a metric that can change between sampling periods. If the CPU ID 405 changes, the monitoring system 200 can add a new node to the collection model 400 with the new CPU ID and can associate any collected metrics such as CPU utilization with the newly-created node.

In certain embodiments, the dashboards 228 of FIG. 2 graphically and/or numerically illustrate the collection model 400 and the related data nodes as the monitoring system 200 collects performance metrics from the monitored hosts. For example, the dashboard(s) 228 can show how nodes are organized and can help identify paths to underlying objects that can be used in queries and/or other dashboards.

For example, in certain embodiments, similar to directory paths, a path in the topology model traverses the collection model 400 through a series of nodes, properties, metrics, and/or events that are separated by forward slashes ("/"). For example, a path that retrieves the current average CPU utilization for a host can look like the following:

HostModel/hosts/<host_name>/cpus/processors/<processor>/utilization/current/average In yet other embodiments, other types of models other than collection models can be used or created for use with the disclosed monitoring systems. For instance, virtual models can be used that are built on top of other models.

As discussed previously, certain embodiments of the monitoring systems disclosed herein can advantageously monitor performance data, such as metrics, over an extended period of time with respect to a virtual environment. Such embodiments allow, for example, a user to analyze how the change in one component of the virtual environment affects the performance of other components.

Figure 5:
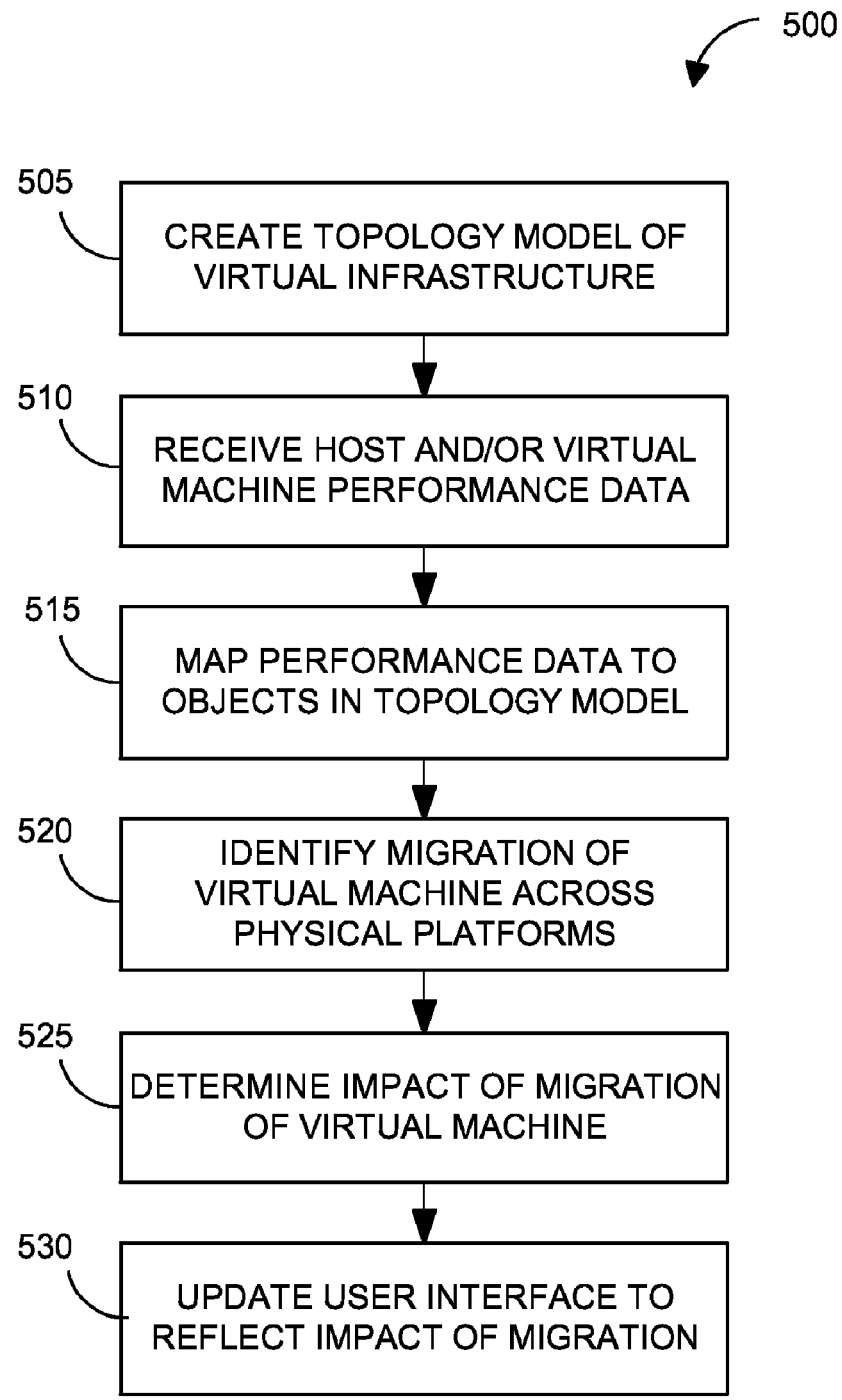
FIG. 5 illustrates a flowchart of an exemplary process for determining the impact of migrating a virtual machine, according to certain embodiments of the invention.

One example of such analysis is shown in FIG. 5, which illustrates an exemplary flowchart of a process 500 for determining the impact of migrating a virtual machine across physical platforms. For instance, in a VMWARE environment, VMOTION can be used to proactively shift a virtual machine across host servers in a cluster to preempt downtime from certain actions, such as patching physical hosts. VMO- TION also provides a manual method for a system administrator to better balance virtual machine workloads based on resource utilization trends.

However, migration of a virtual machine from one host server to another can have a significant impact on the resources of the host machines. In view of the foregoing, certain embodiments of the invention are configured to perform the process 500 to provide an impact analysis on a destination host as a result of migrating a virtual machine instance across host servers. For exemplary purposes, the process 500 will be described with reference to the components illustrated in FIGS. 1 and 2.

The process 500 begins at Block 505, wherein the topology engine 236 of the monitoring system 200 constructs a topology model of the virtual infrastructure being monitored. In certain embodiments, the topology engine 236 receives data identifying the objects in the virtual infrastructure from one or more management servers 102*a*, 102*b* and/or from the objects themselves. In certain embodiments, the topology model indicates the relationships between virtual objects (e.g., virtual machines 108*a*, 108*b*) and physical objects (e.g., host servers 106*a*, 106*b*). For instance, the topology model can show which virtual machines are running on particular host servers in the virtual environment.

At Block 510, the process 500 receives performance data relating to the host servers 106*a*, 106*b* and/or virtual machines 108*a*, 108*b* of the monitored environment. In certain embodiments, the monitoring system 200 receives the data from one or more of the management servers 102*a*, 102*b*. For instance, the topology engine 236 can receive the data from a web service API of the management servers 102*a*, 102*b*. In other embodiments, the monitoring system 200 receives the performance data (e.g., metrics) directly from the monitored objects, such as through a remote agent residing on and/or in communication with the monitored object.

At Block 515, the topology engine 236 and/or the correlation engine 238 then maps the performance data to objects within the topology model. For instance, such metrics can include, but are not limited to, CPU usage (e.g., CPU MHz), memory usage, network load, disk utilization, combinations of the same or the like. Of particular interest, in certain embodiments, are parameters related to the resources of the physical platforms involved in the migration.

At Block 520, the monitoring system 200 (e.g., with the migration modeler 244) identifies the migration of a virtual machine 108*a*, 108*b* across physical host servers 106*a*, 106*b*. In certain embodiments, such identification includes the virtual machine being moved or migrated, the source host server and the destination host server. In certain embodiments, the identification information is obtained from the management servers 102*a*, 102*b* coordinating the migration of the virtual machine.

At Block 525, the migration modeler 244 of the monitoring system 200 determines the impact of migrating the virtual machine to the destination host server. For instance, in certain embodiments, the migration modeler 244 performs a statistical assessment of the CPU, network, memory and/or disk loads that are placed on the target physical host server by all the virtual machines running thereon, including a recently-migrated virtual machine. For example, the migration modeler 244 can compare the new load on the particular server (e.g., following the migration) with its preexisting load, a theoretical maximum and/or a user defined threshold.

At Block 530, the monitoring system 200 updates the user interface 220 to display the impact of migrating the virtual machine. In certain embodiments, the monitoring system 200 can issue one or more alarms 230 if the migration of the virtual machine causes certain rules to fire. For example, such alarms 230 can flag the migration as a problem if the migration impacts the performance of either the migrated virtual machine and/or the virtual machines already on the target physical server, thereby linking the identified problem to the migration event to pinpoint the root cause.

Figure 6:
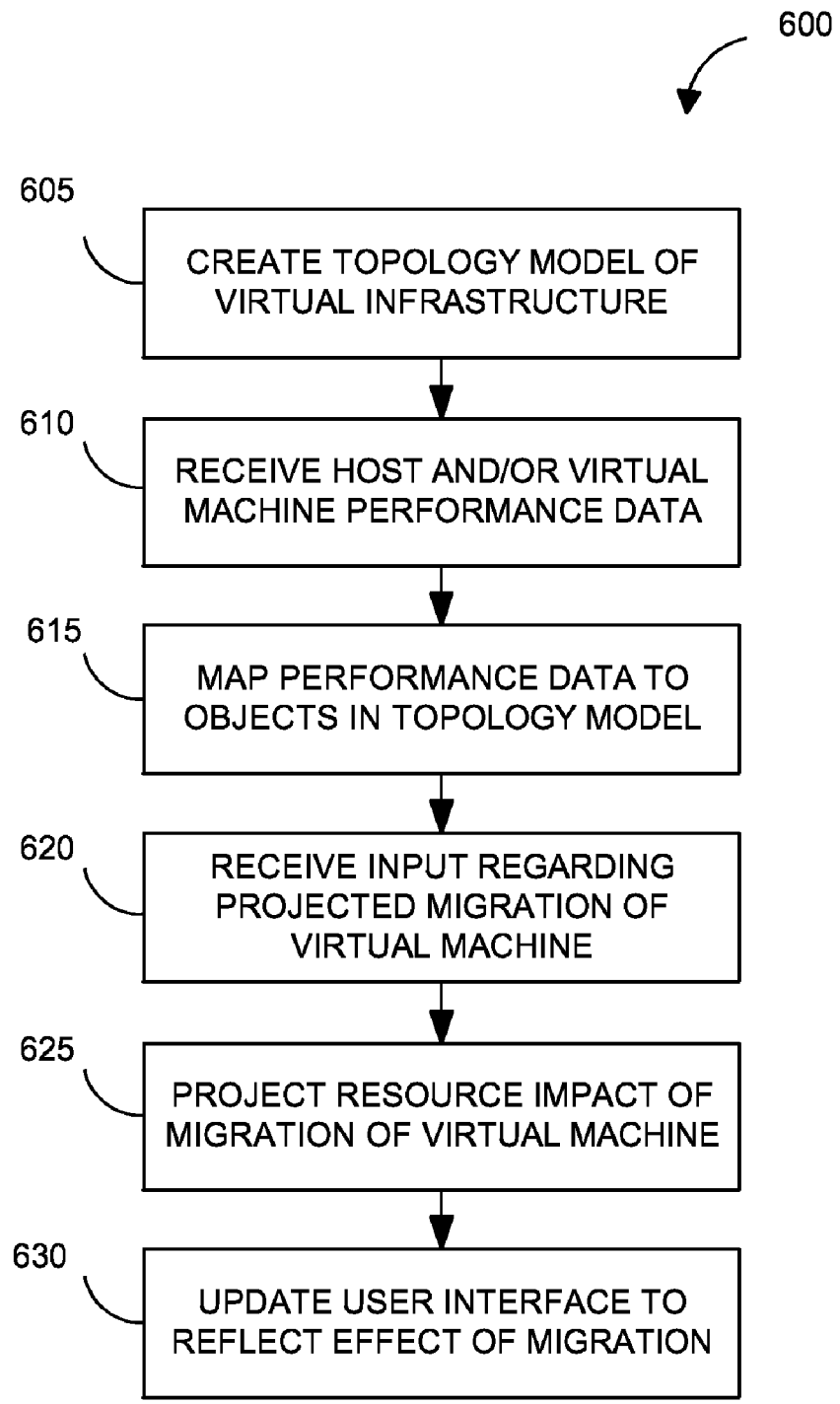
FIG. 6 illustrates a flowchart of an exemplary process for projecting the resource impact in response to migrating a virtual machine, according to certain embodiments of the invention.

FIG. 6 further illustrates an exemplary flowchart of a process 600 for projecting the resource impact of migrating a virtual machine workload from one host server to another. In certain embodiments, monitoring system 200 performs the process 600 to alert the user of possible problems that could occur based on the anticipated migration of the virtual machine. Based on the results of the process 600, the user can advantageously determine whether or not to carry out or modify the migration of the virtual machine.

Similar to the process 500, the process 600 begins at Block 605, wherein the topology engine 236 of the monitoring system 200 constructs a topology model of the virtual infrastructure being monitored. At Block 610, the process 600 receives performance data relating to the host servers 106*a*, 106*b* of and/or virtual machines 108*a*, 102*b* of the monitored environment. At Block 615, the topology engine 236 and/or the correlation engine 238 then maps the performance data to objects within the topology model.

At Block 620, the monitoring system 200 receives input regarding a projected migration of a virtual machine 108*a*, 108*b* across physical host servers 106*a*, 106*b*. In certain embodiments, such identification includes the virtual machine that is to be migrated, the source host server and the target host server. In certain embodiments, this identification information is obtained from the user. In other embodiments, the identification information can be based on a scheduled migration of the virtual machine or can be provided through the management servers 102*a*, 102*b*.

At Block 625, the monitoring system 200 determines a projected impact on resources of the target host server in response to the anticipated migration of the virtual machine. In certain embodiments, the correlation processing engine 238 of the monitoring system 200 accesses historical data with respect to metrics (e.g., utilization of CPU, memory, disk and/or network resources) concerning the operation of the virtual machine on the source host server.

The migration modeler 244 of the monitoring system 200 then uses this historical data to provide estimated usage statistics for the target host server after the virtual machine is to be migrated. In certain embodiments, the migration modeler 244 can select the worst-case utilization of one or more of the metrics and project such utilization onto the target host server based on the knowledge of the monitoring system 200 as to the performance of other virtual machines and resources of the target host server.

At Block 630, the migration modeler 244 of the monitoring system 200 updates the user interface 220 to display to the user, such as one or more on-screen graphics, the impact of migrating the virtual machine. In certain embodiments, the monitoring system 200 can issue one or more alarms 230 if the migration of the virtual machine causes certain rules to fire (e.g., a projected resource consumption exceeding a predetermined threshold for a particular duration of time).

In certain embodiments, the above-described process 600 can be performed for a variety of target host servers. Such embodiments can advantageously allow a user to determine which of the multiple target host servers would be best situated to receive the migration of the subject virtual machine. That is, the process 600 can be used to automatically perform load balancing in a virtual infrastructure comprising multiple virtual machines running on multiple host servers.

Figure 7A:
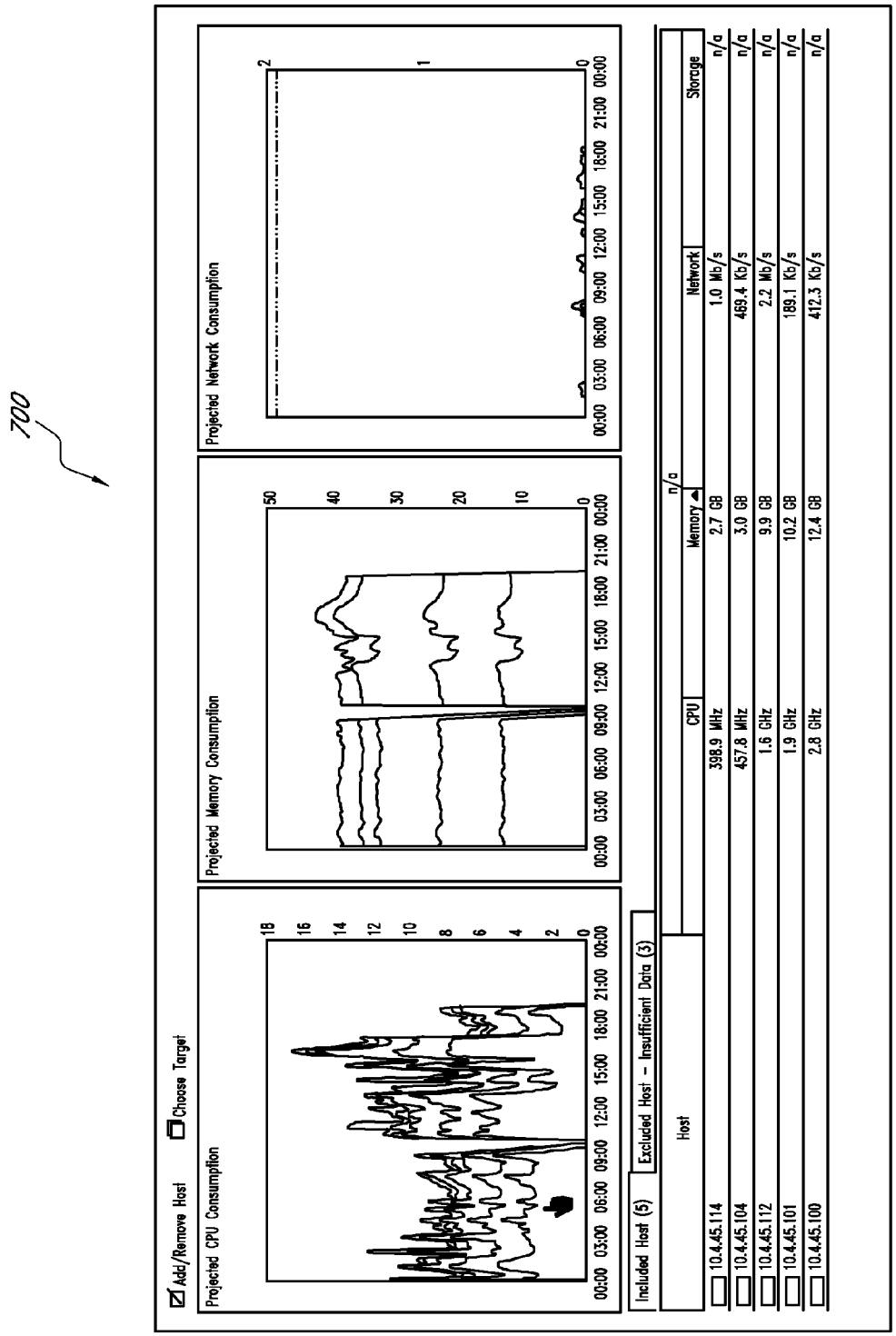
FIGS. 7A-7C illustrate exemplary screen displays of a user interface for displaying a projected resource impact in response to the migration of a virtual machine, according to certain embodiments of the invention.
Figure 7B:
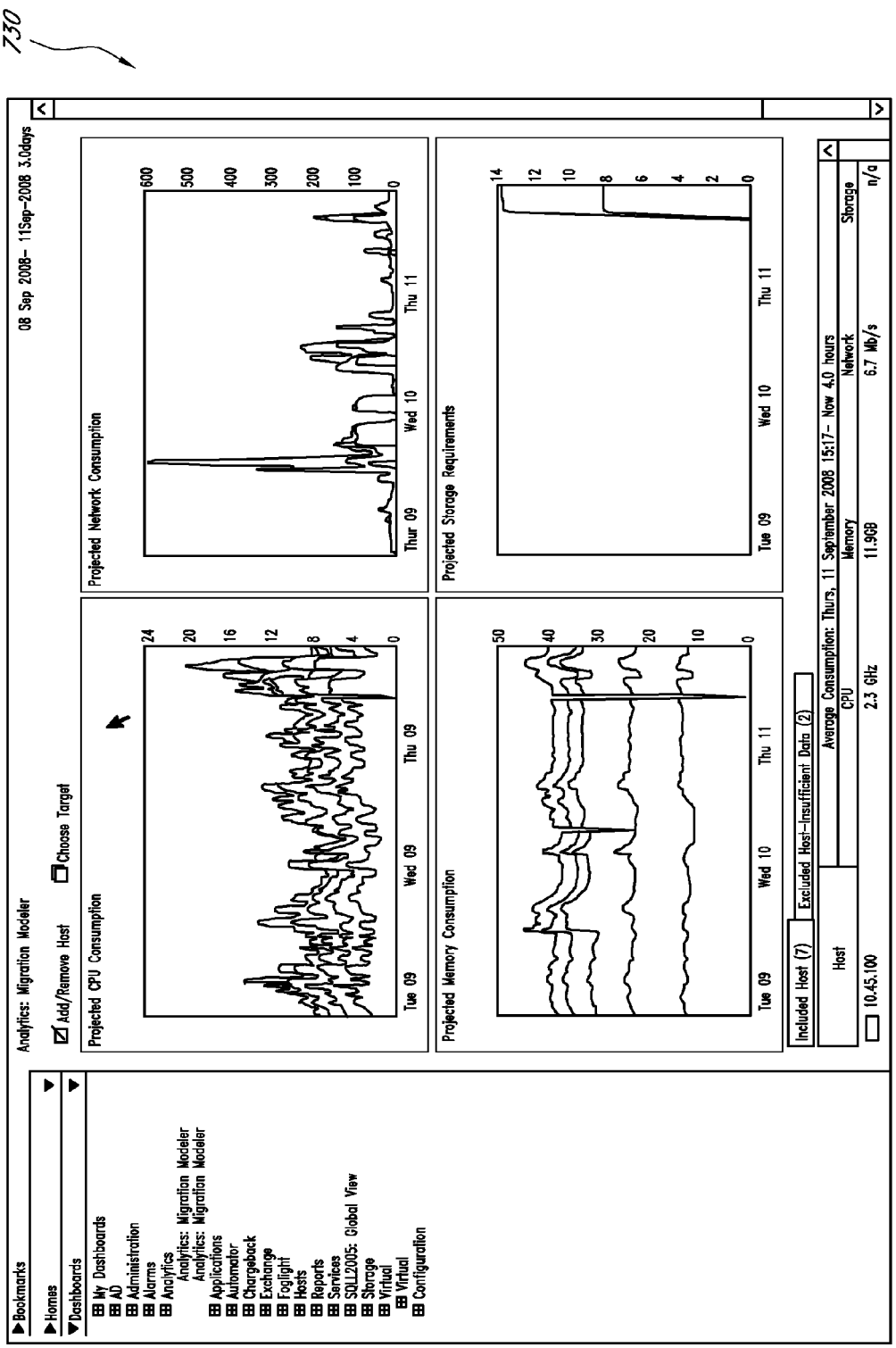
Figure 7C:
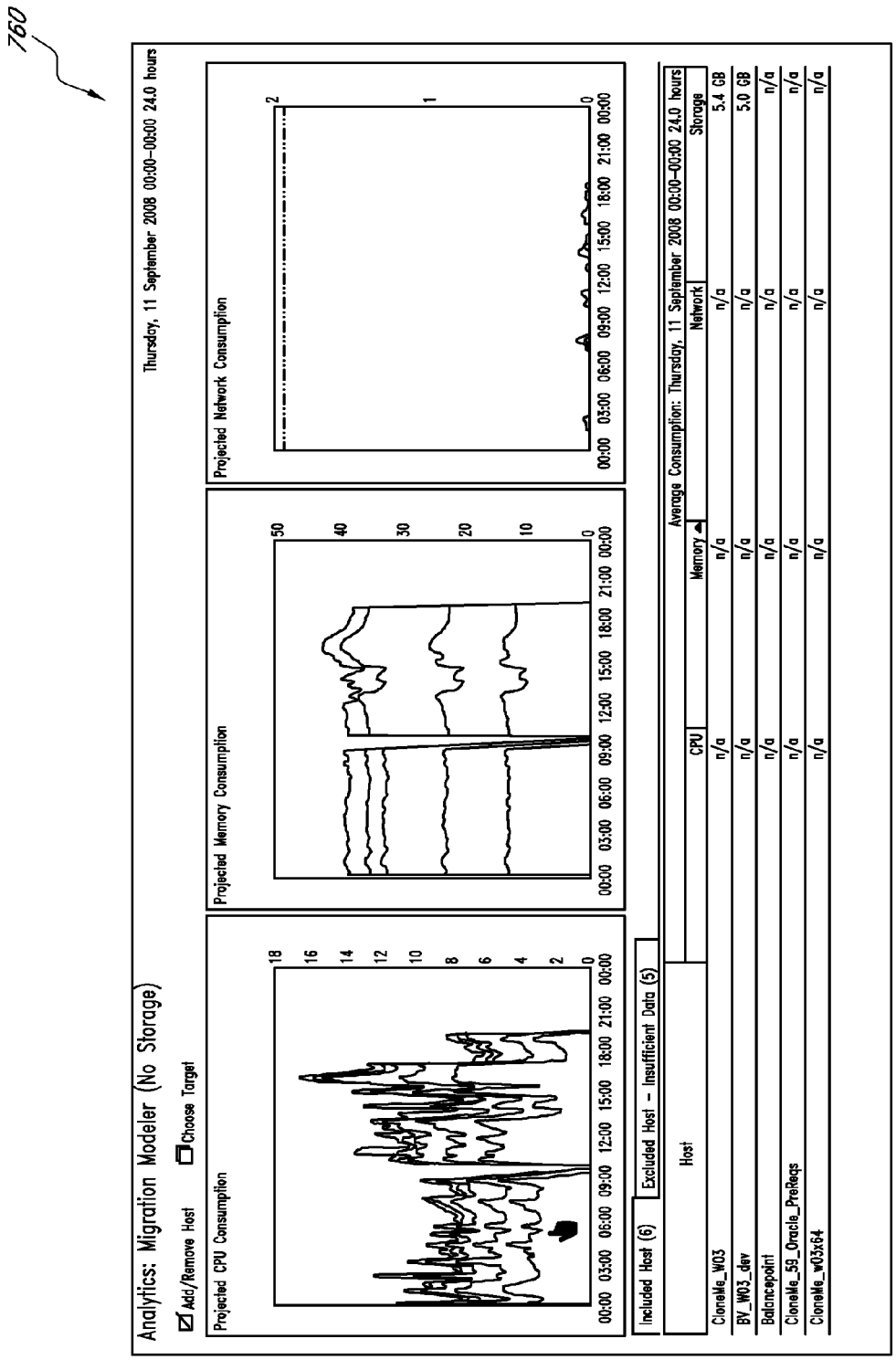

FIGS. 7A-7C illustrate exemplary screen displays of a user interface for displaying a projected resource impact in response to the migration of a virtual machine, according to certain embodiments of the invention. In certain embodiments, the screen displays present in a single view the projected performance impact of migrating a virtual machine based solely on a selection of the virtual machine and the target host server.

In particular, screen display 700 of FIG. 7A illustrates projected resource consumption (i.e., CPU, memory, network) of a plurality of host servers based on the migration of a virtual machine. Screen display 730 of FIG. 7B illustrates a projected resource consumption (i.e., CPU, memory, network, storage) of a plurality of host servers for a period of three days following migration of a virtual machine. FIG. 7C illustrates a screen display 760 further including an interface for identifying particular host servers for which there is insufficient data to project an effect on resource consumption based on a migrated virtual machine.

FIG. 8 illustrates an exemplary screen display 800 of a user interface for monitoring performance of a virtual infrastructure, according to certain embodiments of the invention. As shown, the screen display 800 provides a general view of the entire virtual environment that allows a user to quickly identify current or potential problems through a straightforward graphical display. In certain embodiments, the screen display 800 is produced by the user interface 220 of the monitoring system 200.

In particular, the screen display 800 comprises a virtual infrastructure overview interface 805 that provides a summary of the performance of the monitored virtual infrastructure. A datacenter interface 810 provides summary information of the system performance at each geographical location (datacenter) being monitored. For instance, the data center interface 810 provides information regarding the capacity of datacenters located in Chicago, New York and Los Angeles.

The screen display 800 further comprises four centrally located graphs that illustrate the utilization of selected resources of the virtual infrastructure. These graphs include an infrastructure CPU utilization interface 815, an infrastructure memory utilization interface 820, a datacenter disk utilization interface 825 and a datacenter network utilization interface 830.

The screen display 800 further includes a messages interface 835. In certain embodiments, the messages interface 835 displays to the user messages received from the management servers 102a, 102b regarding performance of the components in the monitored virtual environment. For instance, the messages interface 835 may alert the user when a virtual machine has migrated between hosts. In yet other embodiments, the messages interface 835 can display textual alerts or descriptions that relate to the graphical elements of the screen display 800.

Figure 9:
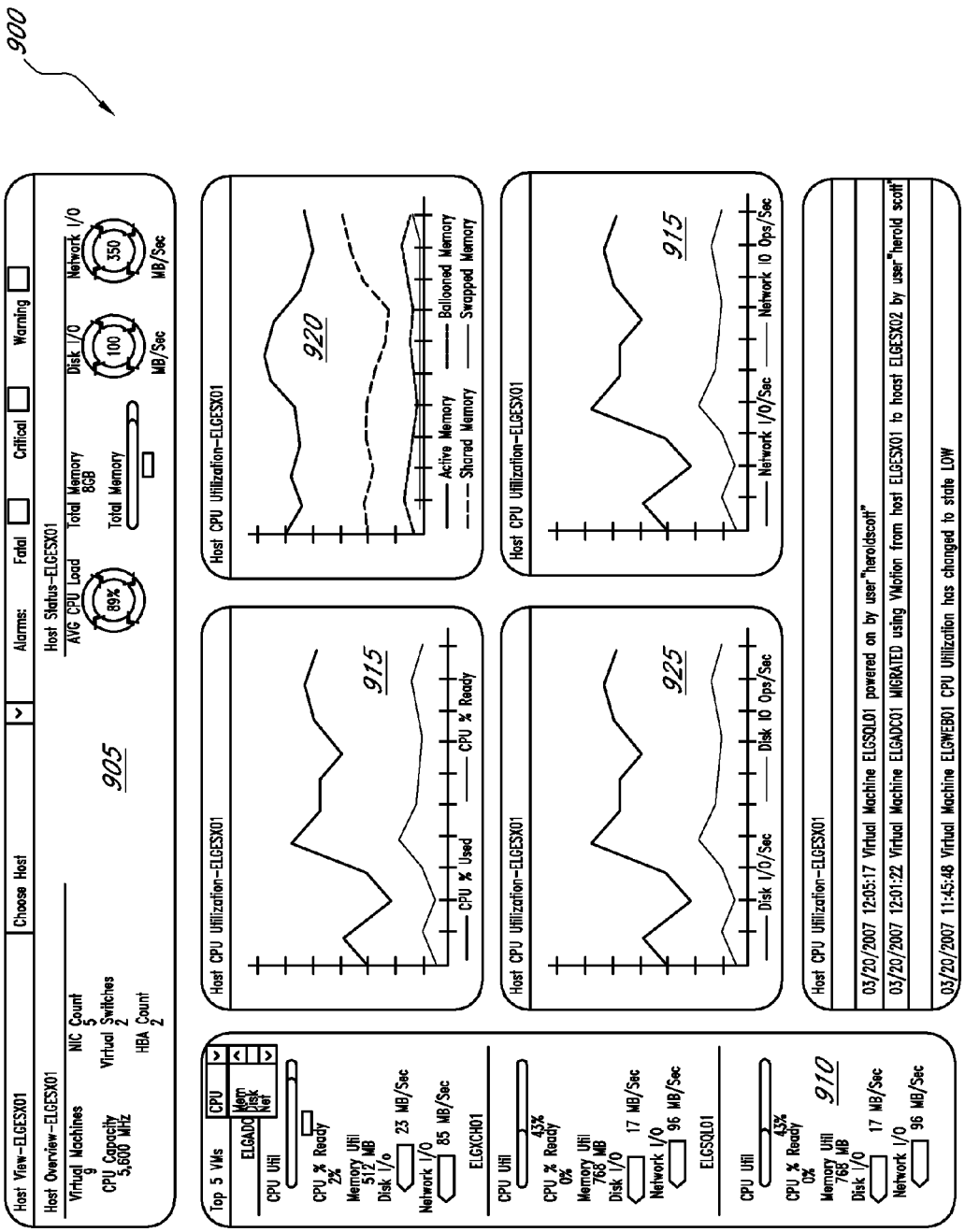
FIG. 9 illustrates an exemplary screen display of a user interface for monitoring the performance of a physical host, according to certain embodiments of the invention.

FIG. 9 illustrates an exemplary screen display 900 of a user interface for monitoring performance of a physical host (i.e., host "ELGESX01"), according to certain embodiments of the invention. As shown, the screen display 900 provides a performance view of a specific host system in the virtual environment. In certain embodiments, the screen display 900 is produced by the user interface 220 of the monitoring system 200.

In particular, the screen display 900 comprises a host overview interface 905 that provides a summary of the performance of the monitored host system. A virtual machine interface 910 provides summary information regarding the virtual machines on the host system that are consuming the highest percentage of a particular resource (e.g., CPU, memory, network, disk). For instance, the illustrated virtual machine interface 910 provides information regarding three virtual machines consuming a relatively high percentage of their allocated processing power.

The screen display 900 further comprises four centrally located graphs that illustrate the utilization of selected resources of the monitored host system. These graphs include a CPU utilization interface 915, a memory utilization interface 920, a disk utilization interface 925 and a network utilization interface 930.

The screen display 900 further includes a messages interface 935 that displays to the user messages associated with the monitored host system. For example, the messages may indicate when a virtual machine on the host server is powered on, when a virtual machine in migrated to or from the host server, combinations of the same or the like.

As discussed above, embodiments of the invention advantageously use knowledge of a virtual environment to generate a topology model of the virtual infrastructure and associated object properties and metrics to reflect the performance of the environment. Although various means of collecting data from the virtual environment have been disclosed herein, the following provides particular details of data collection systems and methods for a VMWARE virtual infrastructure. It will be understood that the following systems and methods are provided as examples and do not limit the scope of the disclosure.

Certain embodiments of the disclosed monitoring systems can utilize a data collection mechanism having three distinct query processes. In general, a connector module performs a pull request (e.g., a web service request) of data at a regularly scheduled interval (e.g., every two minutes). During the pull request, the connector module communicates with a VMWARE collector web service. For instance, the collector web service can be responsible for querying VirtualCenter over its SOAP interface using the VMWARE SDK. As information is returned to the collector, the information undergoes some lightweight data manipulation and is forwarded back to the connector module as XML data. As the connector module receives the data, it stores the date in a datastore of the monitoring system.

In certain embodiments, when the connector module makes a call to the collector service, one of three types of queries can be executed. The first type of query, which is executed at every iteration, is a metric collection. This queries the relevant metrics for each object that is identified in the inventory of the monitoring system. The second type of query, the event query, is also executed at every iteration. The event query can retrieve event messages from VirtualCenter and can be used for determining whether or not significant state or property changes have occurred in the virtual environment.

The third type of query, the inventory query, is executed when a significant state or property change occurs within one of the objects monitored by the monitoring system. This state or property change can be detected through parsing data from the event query. In certain embodiments, significant events that require an inventory update can automatically flag the connector module to perform an inventory update on its next scheduled data collection interval. A few examples of state or property changes that can trigger a new inventory collection are:

A virtual machine changes power state;
A virtual machine is migrated from one host to another;
A virtual machine configuration is modified;
An ESX Host Server changes power state; or
An ESX Host loses connection to VirtualCenter.

In certain embodiments, inventory data is not collected at every interval, but is collected on an as-needed basis, due to the increased time necessary to process this information.

However, in certain circumstances, the VirtualCenter SDK has challenges in handling the size of the requests that are made by monitoring systems, such as in large environments or on systems where significant stress was already placed on the VirtualCenter due to other activity. In such circumstances, VirtualCenter can terminate the requests for data and not return any results.

In view of the foregoing, certain embodiments of the invention comprise a VirtualCenter collector component that tracks each individual request going to VirtualCenter. If the request is terminated and data is not returned, the collector component marks the last known metric and re-establishes its connection with VirtualCenter, continuing where it left off. In addition, the monitoring system flags the number of requests made before the termination occurred and sets an internal configuration variable to identify how many requests can be sent to VirtualCenter prior to losing its connection. This value can then be used to prevent future data collection issues. As the virtual environment grows and/or the VirtualCenter workload increases, the collector component can continue to use this foregoing process to properly adjust the particular value (e.g., number of requests) to a known good setting.

In yet other embodiments of the invention, other data collection methods can be used. For instance, when the collector component performs a GetInventory request, the resulting data can be stored and used for metric collection until a change is detected. Each object of the virtual infrastructure is captured, and another request is sent to VirtualCenter to return a list of available metrics, as well as the metric identification, for each object in the inventory. Each object generates a new connection to VirtualCenter for this behavior.

As can be appreciated, VirtualCenter can take a significant amount of time to return a complete set of QueryAvailPerfMetrics calls. Once the metrics and identifications are identified, a request for the actual data values for these metrics is captured and forwarded to the connector module to write into the datastore of the monitoring system. This performance query can be performed in batches based on a dynamic concurrent object variable.

As stated, this process can take a significant amount of time to query all available system performance metrics. In view of the foregoing, certain embodiments of the invention use a collector service that makes a single call to VirtualCenter to retrieve a minimal amount of available performance counter information. The metric identification information is contained within this response, thus alleviating the need to perform the QueryAvailPerfMetrics call for each inventory object.

Furthermore, in certain embodiments, the systems and methods described herein can advantageously be implemented using computer software, hardware, firmware, or any combination of software, hardware, and firmware. In one embodiment, the system is implemented as a number of software modules that comprise computer executable code for performing the functions described herein. In certain embodiments, the computer-executable code is executed on one or more general purpose computers. However, a skilled artisan will appreciate, in light of this disclosure, that any module that can be implemented using software to be executed on a general purpose computer can also be implemented using a different combination of hardware, software or firmware. For example, such a module can be implemented completely in hardware using a combination of integrated circuits. Alternatively or additionally, such a module can be implemented completely or partially using specialized computers designed to perform the particular functions described herein rather than by general purpose computers.

Moreover, certain embodiments of the invention are described with reference to methods, apparatus (systems) and computer program products that can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the acts specified herein to transform data from a first state to a second state.

These computer program instructions can be stored in a computer-readable memory that can direct a computer or other programmable data processing apparatus to operate in a particular manner, such that the instructions stored in the computer-readable memory produce an article of manufacture including instruction means which implement the acts specified herein.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the acts specified herein.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A system for monitoring data in a virtual computing environment, the system comprising:
   computer hardware including at least one computer processor and a computer display; and
   a plurality of modules stored in computer-readable storage and comprising computer-readable instructions that, when executed by the computer processor, cause the computer hardware to perform operations defined by the computer-executable instructions, the modules including:
      a topology module configured to receive object data indicative of a plurality of objects in a virtual computing environment, the topology module being further configured to:
         transform the object data into a topology model comprising a plurality of interconnected topology objects, the topology model being representative of existing relationships between the plurality of objects in the virtual computing environment, wherein the plurality of objects comprises at least a source physical platform, a virtual machine that operates on the source physical platform, and a target physical platform, wherein the source physical platform is physically distinct from the target physical platform, receive metric data indicative of measured performance values associated with the plurality of objects, and associate the metric data with the plurality of interconnected topology objects of the topology model, thereby mapping performance values within the metric data to objects within the topology model;

a correlation module configured to correlate the associated metric data accumulated over a period of time;

a migration modeler module configured to:
receive input regarding an anticipated migration of the virtual machine from the source physical platform to the target physical platform;
select a worst-case utilization of one or more measured performance values within the metric data; and
use at least the correlated metric data to generate impact data indicative of a projected future impact on resources of at least the target physical platform that is expected to occur upon the anticipated migration of the virtual machine to the target physical platform;
and
a user interface module configured to receive the impact data and to cause, prior to the migration of the virtual machine, the projected impact on the resources of at least the target physical platform to be displayed on the computer display, such that a user can know the projected impact on the resources of at least the target physical platform before the virtual machine is migrated to the target physical platform.

2. The system of claim 1, wherein the projected impact is indicative of an effect on at least one other virtual machine executing on the target physical platform.

3. The system of claim 1, wherein the correlation module is configured to examine a history of the received metric data associated with the source physical platform to generate the correlated metric data.

4. The system of claim 1, further comprising a database configured to store at least the object data and the metric data.

5. The system of claim 1, further comprising an alarm module configured to generate an alert when the projected impact on at least one of the resources of the target physical platform exceeds a predetermined threshold.

6. The system of claim 1, wherein the graphical display comprises a comparison of (i) the projected impact on the resources and (ii) projected metric data associated with the resources excluding the migration of the virtual machine.

7. The system of claim 1, wherein the source and target physical platforms comprise VMWARE ESX servers.

8. The system of claim 1, further comprising at least one remote agent configured to provide the object data to the topology module.

9. The system of claim 1, wherein the at least one remote agent resides on the target physical platform.

10. A method for modeling performance of a virtual computing environment, the method comprising:

receiving metric data indicative of performance values associated with a plurality of objects in a virtual infrastructure, the plurality of objects comprising at least a first host server and a second host server, wherein the first host server and the second host server are physically distinct;

associating the metric data with a topology model comprising a plurality of interconnected topology objects, the topology model being representative of relationships between the plurality of objects in the virtual infrastructure, thereby mapping performance values within the metric data with objects within the topology model;

receiving input indicative of a migration of a virtual machine from the first host server to the second host server;

generating, based at least on the associated metric data and the topology model, impact data indicative of a projected future impact on resources of at least the second host server that is expected to occur in response to the migration of the virtual machine to the second host server; and displaying, based on said impact data, on-screen graphics indicative of the projected future impact on the resources of at least the second host server such that a user can know the projected impact on the resources of at least the second host server before the virtual machine is migrated to the second host server.

11. The method of claim 10, wherein the plurality of objects comprises both physical devices and virtual components.

12. The method of claim 10, wherein the migration is a projected migration of the virtual machine from the first host server to the second host server.

13. The method of claim 12, wherein said displaying is performed prior to the migration of the virtual machine to the second host server.

14. The method of claim 10, wherein said receiving comprises obtaining the metric data from a management server in communication with the first and second host servers.

15. The method of claim 10, wherein the resources comprise at least one of CPU utilization, memory utilization and network utilization of the second host server.

16. The method of claim 10, further comprising displaying on-screen graphics indicative of the projected impact on resources of a plurality of host servers including the second host server.

17. The method of claim 16, further comprising automatically selecting another host server of the plurality of host servers to receive the migration of the virtual machine, wherein a second projected impact of the migration to the another host server is less than the projected impact of the migration to the second host server.

18. The method of claim 10, additionally comprising correlating the associated metric data acquired over a predetermined period of time prior to said migration.

* * * * *